(12) United States Patent
Mohamed Saheed et al.

(10) Patent No.: US 12,713,925 B2
(45) Date of Patent: Aug. 18, 2026

(54) SEMICONDUCTOR DEVICE AND METHOD OF MANUFACTURING A SEMICONDUCTOR DEVICE

(71) Applicant: Infineon Technologies Austria AG, Villach (AT)

(72) Inventors: Mohamed Salleh Mohamed Saheed, Georgetown (MY); Murugalogeswaran Permal, Sungkai (MY)

(73) Assignee: Infineon Technologies Austria AG, Villach (AT)

( * ) Notice: Subject to any disclaimer, the term of this patent is extended or adjusted under 35 U.S.C. 154(b) by 361 days.

(21) Appl. No.: 18/589,584

(22) Filed: Feb. 28, 2024

(65) Prior Publication Data

US 2024/0297127 A1 Sep. 5, 2024

(30) Foreign Application Priority Data

Mar. 1, 2023 (DE) ......................... 102023201847.0

(51) Int. Cl.
*H10W 42/00* (2026.01)
*H10W 29/00* (2026.01)

(52) U.S. Cl.
CPC ........... *H10W 42/00* (2026.01); *H10W 29/00* (2026.01); *H10W 29/01* (2026.01)

(58) Field of Classification Search
CPC ...... H10W 42/00; H10W 29/01; H10W 29/00
See application file for complete search history.

(56) References Cited

U.S. PATENT DOCUMENTS

2016/0240667 A1 8/2016 Kocon et al.
2019/0259868 A1 * 8/2019 Kawahara .......... H10D 30/0295
2020/0258848 A1 * 8/2020 Kim ...................... H10W 42/00

* cited by examiner

*Primary Examiner* — Robert J Michaud
(74) *Attorney, Agent, or Firm* — Murphy, Bilak & Homiller, PLLC

(57) ABSTRACT

A semiconductor device is provided. The semiconductor device includes a substrate and an isolation region at a first main surface of the substrate. The isolation region includes a lower portion and an upper portion that protrudes from the lower portion. The semiconductor device further includes a charge shielding layer over at least a part of the upper portion of the isolation region. An edge of the charge shielding layer has a sidewall which slopes inward at a first angle of equal to or less than 50 degrees. The semiconductor device further includes a metal barrier layer over at least a part of the charge shielding layer and over at least a part of the lower portion of the isolation region. A method of manufacturing the semiconductor device is also described.

20 Claims, 4 Drawing Sheets

FIG 3A
110
104
102
y
x
FIG 3B
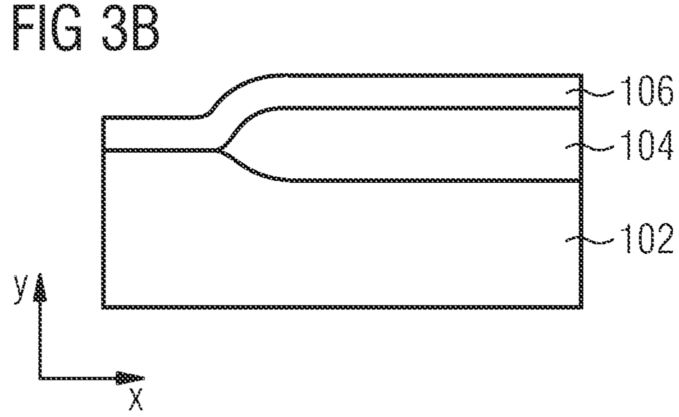
FIG 3C
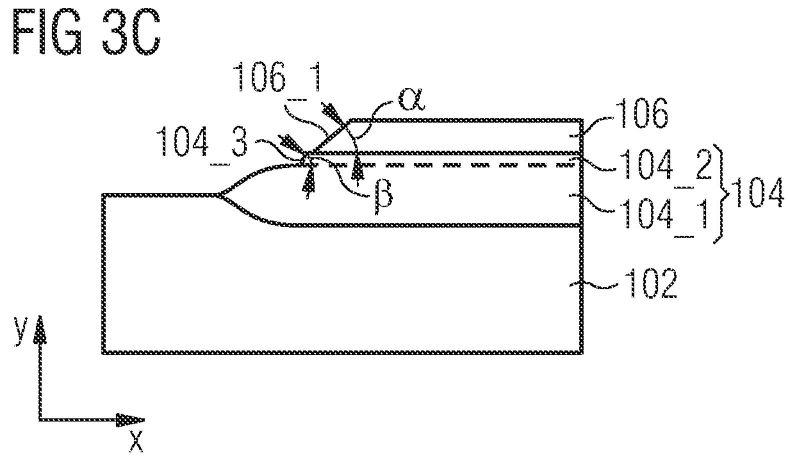

108
106
104
102
y
x 212
108
106
104
102
y
x

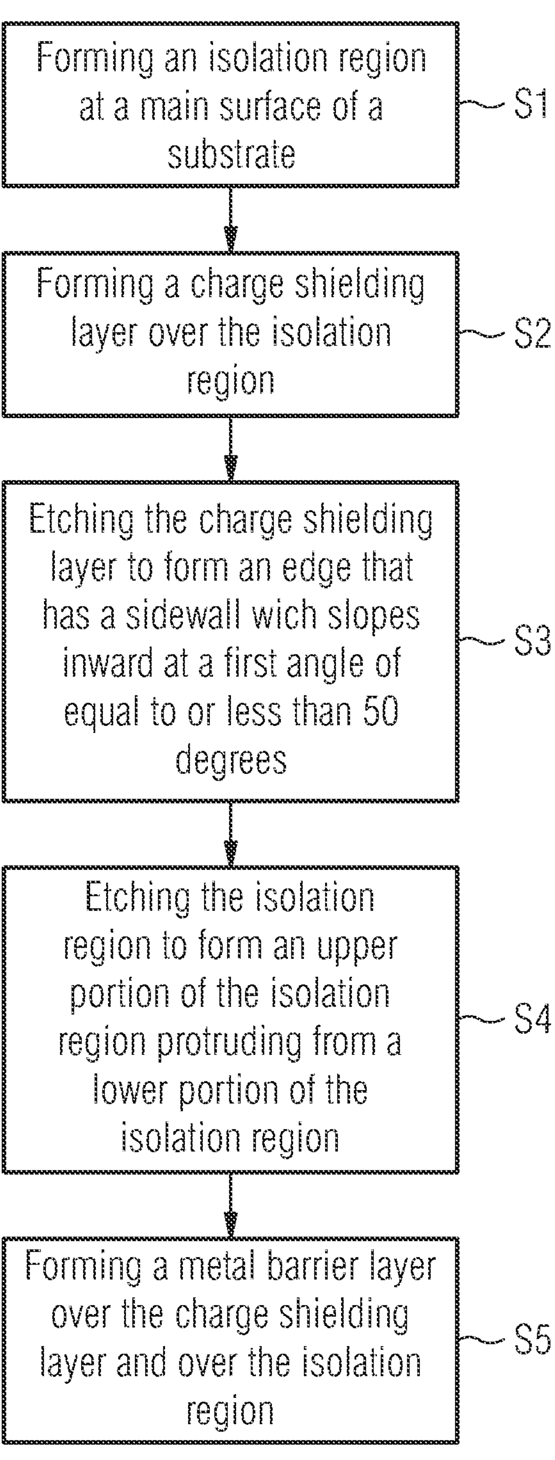
FIG 4
Forming an isolation region at a main surface of a substrate
S1
Forming a charge shielding layer over the isolation region
S2
Etching the charge shielding layer to form an edge that has a sidewall wich slopes inward at a first angle of equal to or less than 50 degrees
S3
Etching the isolation region to form an upper portion of the isolation region protruding from a lower portion of the isolation region
S4
Forming a metal barrier layer over the charge shielding layer and over the isolation region
S5

SEMICONDUCTOR DEVICE AND METHOD OF MANUFACTURING A SEMICONDUCTOR DEVICE

TECHNICAL FIELD

The present disclosure relates to a semiconductor device and a method of manufacturing a semiconductor device.

BACKGROUND

For power semiconductor devices, there are standardized robustness tests in particular HTRB (high temperature reverse bias test) and H3TRB (high humidity high temperature reverse bias test). In these tests, many power semiconductor devices show an insufficient robustness against mobile ions causing failure of the devices. Accordingly, there is a need to improve power semiconductor devices.

SUMMARY

According to an embodiment of a semiconductor device, the semiconductor device comprises a substrate and an isolation region that is formed at a first main surface of the substrate. The isolation region comprises a lower portion and an upper portion that protrudes from the lower portion. The semiconductor device further comprises a charge shielding layer formed over at least a part of the upper portion of the isolation region. An edge of the charge shielding layer has a sidewall which slopes inward at a first angle of equal to or less than 50 degrees. The semiconductor device further comprises a metal barrier layer formed over at least a part of the charge shielding layer and over at least a part of the lower portion of the isolation region.

According to an embodiment of a method of manufacturing a semiconductor device, the method comprises forming an isolation region at a main surface of a substrate. The method further comprises forming a charge shielding layer over the isolation region and etching the charge shielding layer to form an edge that has a sidewall which slopes inward at a first angle of equal to or less than 50 degrees. The method further comprises etching the isolation region to form an upper portion of the isolation region protruding from a lower portion of the isolation region. The method further comprises forming a metal barrier layer over the charge shielding layer and over the isolation region.

Those skilled in the art will recognize additional features and advantages upon reading the following detailed description, and upon viewing the accompanying drawings.

BRIEF DESCRIPTION OF THE DRAWINGS

The present disclosure is illustrated by way of example, and not by way of limitation, in the figures of the accompanying drawings in which like reference numerals refer to similar or identical elements unless indicated otherwise. The elements of the drawings are not necessarily drawn to scale relative to each other. The features of the various illustrated examples can be combined unless they exclude each other.

FIGS. 3A through 3F illustrate a series of cross-sectional views of an exemplary method of manufacturing a semiconductor device; and FIG. 4 illustrates a flowchart of an exemplary method of manufacturing a semiconductor device.

DETAILED DESCRIPTION

The making and using of several examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention.

The terms “having”, “containing”, “including”, “comprising” and the like are open, and the terms indicate the presence of stated structures, elements or features but do not preclude the presence of additional elements or features. The articles “a”, “an” and “the” are intended to include the plural as well as the singular, unless the context clearly indicates otherwise.

The terms “on” and “over” are not to be construed as meaning only “directly on” and “directly over”. Rather, if one element is positioned “on” or “over” another element (e.g., a layer is “on” or “over” another layer or “on” or “over” a substrate), a further component (e.g., a further layer) may be positioned between the two elements (e.g., a further layer may be positioned between a layer and a substrate if the layer is “on” or “over” said substrate).

Spatially relative terms, such as “beneath,” “below,” “lower,” “above,” “upper”, “under” and the like, are used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
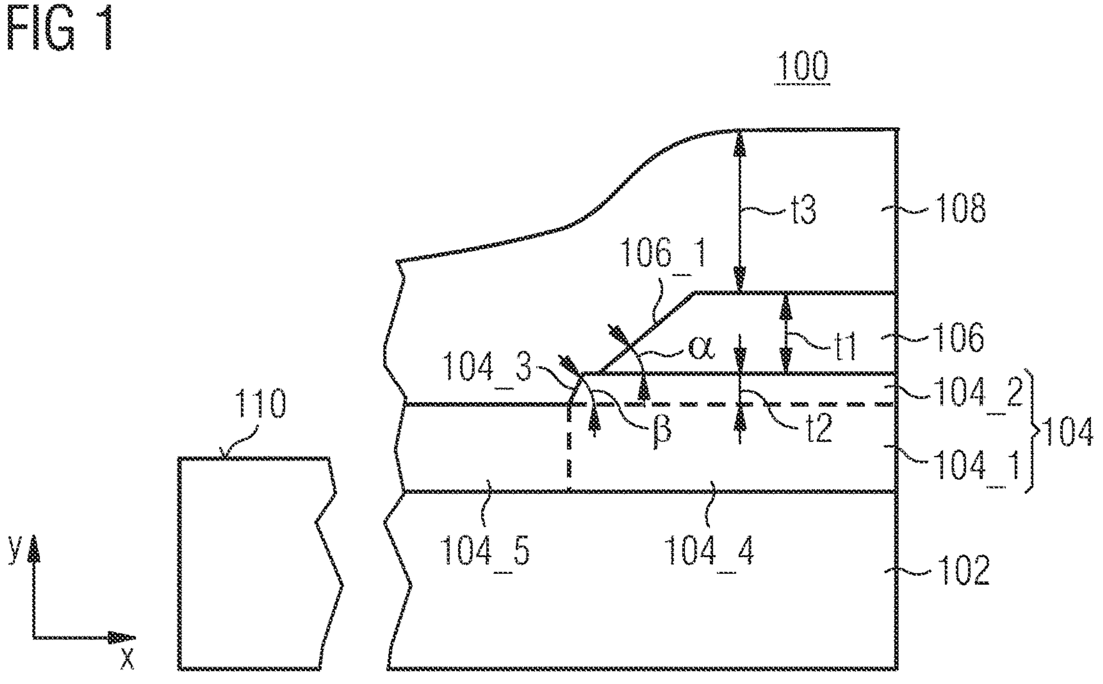
FIGS. 1 and 2 illustrate partial cross-sectional views of exemplary semiconductor devices.

FIG. 1 illustrates a partial cross-sectional view of an exemplary semiconductor device 100. The semiconductor device 100 includes a substrate 102. The substrate 102 may include one or more of a variety of semiconductor materials that are used to form semiconductor devices. For example, the substrate 102 may include single element semiconductors (e.g. Si, Ge, etc.), silicon-on-insulator semiconductors, binary semiconductors (e.g. SiC, GaN, GaAs, SiGe, etc.), ternary semiconductors (e.g. AlGaN, InGaAs, InAlAs, etc.). The substrate 102 may be a bulk semiconductor material or may include one or more additional elements, like e.g., epitaxial layers grown on a bulk semiconductor material. The substrate 102 has a first main surface 110 and a second main surface (not illustrated) opposite the first main surface 110. The first main surface 110 may be referred to as a front surface and the second main surface may be referred to as a back surface. A first direction x is parallel to the first main surface 110 of the substrate 102. The first direction x may be referred to as horizontal direction.

The semiconductor device 100 further includes an isolation region 104 formed at the first main surface 110 of the substrate 102. The isolation region 104 may be formed in direct contact with the substrate 102. Alternatively, one or more layers may be interposed between the substrate 102 and the isolation region 104. The isolation region 104 comprises a dielectric material and, in one example, the isolation region 104 may be a LOCOS (Local Oxidation of Silicon) region. In one example, the isolation region 104 may comprise at least one of oxide (e.g., silicon dioxide $SiO_2$), nitride (e.g., silicon nitride $Si_3N_4$) and polysilicon.

The isolation region 104 comprises a lower portion 104_1 and an upper portion 104_2 which protrudes from the lower portion 104_1 in a second direction y which is perpendicular to the first direction x. The second direction y may be referred to as vertical direction. Separating the isolation region 104 in the horizontal direction x, the region of the isolation region 104 including the upper portion 104_2 may be referred to as a protruding portion 104_4 of the isolation region 104. The remaining part of the isolation region 104 may be referred to as non-protruding portion 104_5 of the isolation region 104. The lower portion 104_1 and the upper portion 104_2 may together form a contiguous isolation region 104. Likewise, the protruding portion 104_4 and the non-protruding portion 104_5 may together form a contiguous isolation region 104. An edge 104_3 of the upper portion 104_2 of the isolation region 104 has a sidewall which slopes inward at a second angle β between 35 degrees and 90 degrees relative to the first direction x. The sidewall of the edge 104_3 may be referred to as sloped sidewall, inclined sidewall or tapered sidewall. The angle β may be referred to as gradient angle and an average gradient angle β may be between 35 degrees and 90 degrees relative to the first direction x. The upper portion 104_2 protruding from the lower portion 104_1 at the edge 104_3 forms a step-like structure of the isolation region 104. In other words, a surface of the isolation region 104 that faces away from the substrate 102 includes a step topography.

The semiconductor device 100 further includes a charge shielding layer 106 formed over at least a part of the upper portion 104_2 of the isolation region 104. The charge shielding layer 106 may be formed directly on the at least a part of the upper portion 104_2 of the isolation region 104. Alternatively, one or more layers may be interposed between the at least a part of the upper portion 104_2 of the isolation region 104 and the charge shielding layer 106. The charge shielding layer 106 may comprise at least one of nitride, oxide and aluminum. For example, the charge shielding layer 106 may comprise at least one of silicon nitride, silicon oxide, aluminum oxide, aluminum nitride, tantalum nitride, titanium nitride and boron nitride. The charge shielding layer 106 may include a single layer of a same material, e.g., silicon nitride, or a stack of layers having different materials.

As illustrated in FIG. 1, the charge shielding layer 106 covers the protruding portion 104_4 of the isolation region 104 but the charge shielding layer 106 does not cover the non-protruding portion 104_5 of the isolation region 104, i.e., the charge shielding layer 106 does not cover the lower portion 104_1 of the isolation region 104. In one example, the charge shielding layer 106 does not completely cover the upper portion 104_2 of the isolation region 104 and, in an alternative example, the charge shielding layer 106 extends beyond the upper portion 104_2 of the isolation region 104 in the horizontal direction x. A thickness t1 of the charge shielding layer 106 may be at least 100 nm or at least 140 nm. In one example, the thickness t1 of the charge shielding layer 106 may be greater than a thickness t2 of the upper portion 104_2 of the isolation region 104, e.g., the thickness t1 of the charge shielding layer 106 may be at least two times the thickness t2 of the upper portion 104_2 of the isolation region 104. An edge 106_1 of the charge shielding layer 106 has a sidewall which slopes inward at a first angle α of equal to or less than 50 degrees, or of equal to or less than 45 degrees, relative to the first direction x. The sidewall of the edge 106_1 may be referred to as sloped sidewall, inclined sidewall or tapered sidewall. The angle α may be referred to as gradient angle and an average gradient angle α may be equal to or less than 50 degrees, or equal to or less than 45 degrees, relative to the first direction x.

The charge shielding layer 106 prevents mobile ions from diffusing and migrating within the semiconductor device 100 and, this way, mobile ions are prevented from causing degradation or failure of the semiconductor device 100. The charge shielding layer 106 may be referred to as ion barrier layer, ion diffusion barrier layer, charge barrier layer, or the like. The sloped sidewall of the edge 106_1 of the charge shielding layer 106 allows for improved conformal deposition of a metal barrier layer 108 as will be described later herein.

The metal barrier layer 108 is formed over at least a part of the charge shielding layer 106 and over at least a part of the lower portion 104_1 of the isolation region 104. The metal barrier layer 108 may be formed directly on the at least a part of the charge shielding layer 106 and directly on the at least a part of the non-protruding 104_5 portion of the isolation region 104. The metal barrier layer 108 may comprise at least one of Ti, TiW, TiN, W and Ta. The metal barrier layer 108 may include a single layer of a same material, e.g., TiW, or a stack of layers having different materials. A thickness t3 of the metal barrier layer 108 may be at least two times the thickness t1 of the charge shielding layer 106. The metal barrier layer 108 may be referred to as metal diffusion barrier layer.

The construction of the charge shielding layer 106 with the edge 106_1 having a sloped sidewall as described earlier herein allows for a conformal deposition of the metal barrier layer 108. The choice of the thickness t1 of the charge shielding layer 106 in relation to the thickness t2 of the upper portion 104_2 of the isolation region 104 further enhances the conformity of the metal barrier layer 108. As a consequence, the metal barrier layer 108 is tight against diffusion and prevents metal from diffusing into the structures that are located below the metal barrier layer 108. That means, the semiconductor device 100 includes a conformally deposited metal barrier layer 108 that is tight against diffusion of metal that is formed above the metal barrier layer 108. At the same time, the semiconductor device 100 includes a charge shielding layer 106 formed below the metal barrier layer 108, wherein the charge shielding layer 106 prevents mobile ions from diffusing within the semiconductor device 100. As a result, the semiconductor device 100 is robust against degradation and destruction, and allows reliable operation over the specified lifetime. For example, the voltage blocking capability of the semiconductor device 100 is ensured over the specified lifetime. Besides, the semiconductor device 100 is implemented in an area efficient way.

Figure 2:
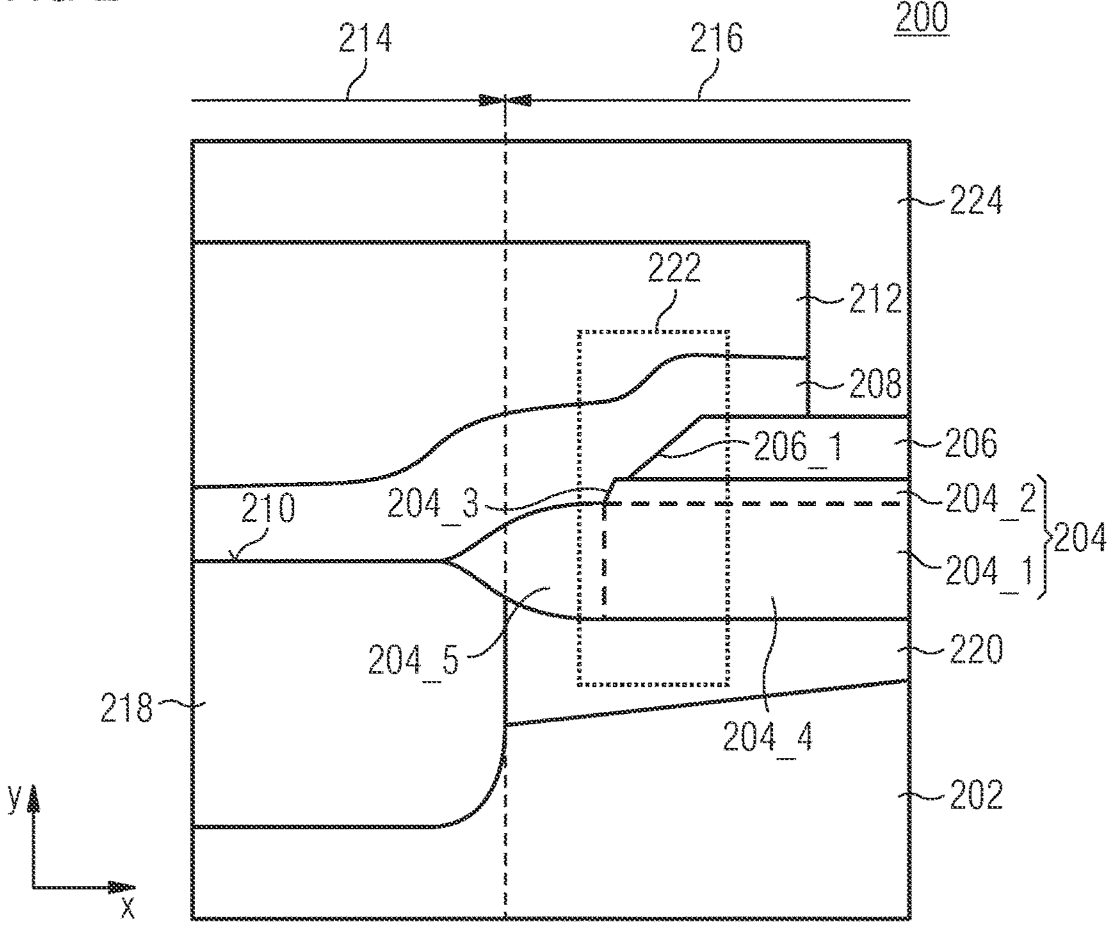

FIG. 2 illustrates a further partial cross-sectional view of an exemplary semiconductor device 200. A doted box 222 within FIG. 2 indicates a section of the semiconductor device 200 that is shown in an enlarged view in FIG. 1. The semiconductor device 200 may be a power semiconductor device that includes a substrate 202 that is similar to the substrate 102 as illustrated and described in connection with FIG. 1. The semiconductor device 200 includes an active region 214 and an edge termination region 216 that is arranged between the active region 214 and an edge (not illustrated) of the semiconductor device 200. The edge of the semiconductor device 200 terminates the substrate 202 in the second direction y and may have become into being by means of, e.g., wafer dicing. In one example, when viewing the semiconductor device 200 from above, the edge termination region 216 at least partially surrounds the active region 214.

The active region 214 of the power semiconductor device 200 includes one or several active devices, such as a transistor and/or a diode, or some other device. The one or several active devices may be referred to as functional devices or semiconductor devices. The power semiconductor device 200 may be a vertical power semiconductor device and the one or several active devices may be configured to conduct a load current between the first main surface 210 of the substrate 202 and the second main surface (not illustrated) of the substrate 202. The power semiconductor device 200 may be configured to conduct load currents of more than 1 A or more than 10 A or even more than 30 A and may be further configured to block voltages between load terminals in the range of tens up to several thousands of volts, e.g. 10V, 400 V, 650V, 1.2 kV, 1.7 kV, 3.3 kV, 4.5 kV, 5.5 kV, 6 kV, 6.5 kV. The active region 214 may be a region of the power semiconductor device 200 configured to conduct a major portion of the load current through the substrate 202 in an on-state or conducting state of the one or several active devices.

The edge termination region 216 includes a structure that provides a transition region in which high electric fields around the active region 214 of the power semiconductor device 200 are reduced gradually towards the edge of the power semiconductor device 200. For example, the edge termination region 216 may lower the intensity of the electric field around the active region 214 by spreading the electric field lines across the edge termination region 216. In one example, as illustrated in FIG. 2, the edge termination region 216 includes a variation of lateral doping (VLD) zone 220. Within the VLD zone 220, the dopant concentration decreases along the first direction x towards the edge of the power semiconductor device 200. The VLD zone 220 is of the first conductivity type and a section of the substrate 202 that adjoins the VLD zone 220 in the second direction y is of a second conductivity type that is opposite to the first conductivity type. It is to be noted that other kinds of or additional edge termination structures may be included in the edge termination region 216 such as a junction terminal extension (JTE) structure, a p-ring structure or a field plate structure.

As further illustrated in FIG. 2, the active region 214 of the power semiconductor device 200 includes at least one diode as active device. The diode includes a well 218 that is formed at the first main surface 210 of the substrate 202. The well 218 is of the first conductivity type and a section of the substrate 202 that adjoins the well 218 in the second direction y is of the second conductivity type. In one example, the well 218 is of p-type and forms an anode of the diode device, and the portion of the substrate 202 that adjoins the well 218 in the second direction y is of n-type and forms a drift section of the diode. The power semiconductor device 200 further includes a cathode (not illustrated) of the diode that is formed at the second main surface of the substrate 202. It is to be noted that other or additional active devices may be included in the active region 214 such as one or several transistors.

The semiconductor device 200 includes an isolation region 204, a charge shielding layer 206 and a metal barrier layer 108 similar to the isolation region 104, the charge shielding layer 106 and the metal barrier layer 108 as previously described herein in connection with FIG. 1. Separating the isolation region 204 in the vertical direction y, the isolation region 204 includes a lower portion 204_1 and an upper portion 204_2 which protrudes from the lower portion 204_1. Separating the isolation region 204 in the horizontal direction x, the isolation region 204 includes a protruding portion 204_4 and a non-protruding portion 204_5. The isolation region 204 is located at the transition between the active region 214 and the edge termination region 216 to electrically isolate parts of the active region 214 from parts of the edge termination region 216. A major part of the isolation region 204 is included in the edge termination region 216 and just a minor part of the isolation region 204 is included in the active region 214.

The dotted box 222 is located in the edge termination region 216, i.e., the charge shielding layer 206 is only formed in the edge termination region 216 but not in the active region 214. The metal barrier layer 208 is formed in the active region 214 and in at least a part of the edge termination region 216. Within the active region 214, the metal barrier layer 208 may be formed directly on the well 218, whereas in the edge termination region 216 the metal barrier layer 208 is electrically isolated from the VLD zone 220 by the isolation region 204 and the charge shielding layer 206.

The semiconductor device 200 further includes a metal layer 212 formed over at least a part of the metal barrier layer 208. The metal layer 212 may be formed directly on the at least a part of the metal barrier layer 208. Alternatively, one or more layers may be interposed between the at least a part of the metal barrier layer 208 and the metal layer 212. The metal layer 212 is formed in at least a part of the active region 214 and in at least a part of the edge termination region 216. For example, the metal layer 212 may comprise copper (Cu). In other examples, the metal layer 212 may comprise at least one of aluminum (Al), nickel (Ni) and palladium (Pd), like e.g., AlCu. The metal layer 212 is arranged in electrical contact with the well 218 via the metal barrier layer 208 to form an anode electrode of the semiconductor device 200.

The semiconductor device 200 further includes a passivation layer 224 to cover and protect the underlying structures. The passivation layer 224 may include a single layer of a same material or a stack of layers having different materials. For example, the passivation layer 224 may comprise at least one of silicon, nitride, aluminum, oxide, silicate glass and imide. The passivation layer 224 is formed in the active region 214 and in the edge termination region 216. Within the edge termination region 216, the passivation layer 224 may be formed directly on at least a part of the charge shielding layer 206.

Within the semiconductor device 200, the charge shielding layer 206 is provided within the edge termination region 216 to prevent mobile ions from diffusing and migrating within the semiconductor device 200. Forming the charge shielding layer 206 with an edge 206_1 having a sloped sidewall as described earlier herein in connection with FIG. 1 allows for a conformal deposition of the metal barrier layer 208 even in the presence of a step topography in the isolation region 204 at an edge 204_3. With respect to the horizontal direction x, the edge 206_1 of the charge shielding layer 206 is located approximately at a same position as the edge 204_3 of the upper portion 204_2 of the isolation region 204. That means, the edge 206_1 of the charge shielding layer 206 is located in the vicinity of the edge 204_3 of the upper portion 204_2 of the isolation region 204. As a consequence, the metal barrier layer 208 is tight against diffusion and prevents metal of the metal layer 212 from diffusing into the structures that are located below the metal barrier layer 208. That means, the semiconductor device 200 includes a conformally deposited barrier layer 208 that is tight against diffusion and, at the same time, includes a charge shielding layer 206 formed below the metal barrier layer 208, wherein the charge shielding layer 206 prevents mobile ions from diffusing within the semiconductor device 200. As a result, the semiconductor device 200 is robust against degradation and destruction, and allows reliable operation over the specified lifetime.

FIGS. 3A through 3F illustrate a series of cross-sectional views of an exemplary method of manufacturing a semiconductor device. The method as will be described in connection with FIGS. 3A through 3F may be used to manufacture a semiconductor device similar to one of the semiconductor devices 100, 200 as illustrated and described in connection with FIG. 1 and FIG. 2.

As shown in FIG. 3A, an isolation region 104 is formed at a first main surface 110 of a substrate 102. The isolation region 104 comprises a dielectric material and, in one example, the isolation region 104 may be a LOCOS (Local Oxidation of Silicon) region. In one example, the isolation region 104 may comprise at least one of oxide (e.g., silicon dioxide $SiO_2$), nitride (e.g., silicon nitride $Si_3N_4$) and polysilicon, e.g., at least one of grown and/or deposited oxide or nitride.

As shown in FIG. 3B, a charge shielding layer 106 is formed over the isolation region 104. The charge shielding layer 106 may be formed by a deposition, e.g., chemical vapor deposition, atomic layer deposition, or any other suitable deposition technique. In one example, the charge shielding layer 106 may be formed directly on the isolation region 104. The charge shielding layer 106 may comprise at least of one silicon nitride, silicon oxide, aluminum oxide, aluminum nitride, tantalum nitride, titanium nitride and boron nitride.

FIG. 3C shows the semiconductor device after an etching step has been performed. Standard semiconductor processing such as photolithography, masking and etching may be used to structure the charge shielding layer 106. After etching, an edge 106_1 of the structured charge shielding layer 106 has a sidewall which slopes inward at a first angle $\alpha$ of equal to or less than 50 degrees, or of equal to or less than 45 degrees, with respect to a first direction x. The edge 106_1 may be referred to as defined edge 106_1 and the charge shielding layer 106 may be referred to as structured charge shielding layer 106.

As illustrated in FIG. 3C, part of the isolation region 104 is also etched to form an upper portion 104_2 which protrudes from the lower portion 104_1 of the isolation region 104 in a second direction y which is perpendicular to the first direction x. A defined edge 104_3 of the upper portion 104_2 of the isolation region 104 is formed which, in one example, has a sidewall which slopes inward at a second angle $\beta$ between 35 degrees and 90 degrees relative to the first direction x. The upper portion 104_2 and the edge 104_3 are created by etching the isolation region 104 at a surface that faces away from the substrate 102. In one example, the etching of the charge shielding layer 106 and the etching of the isolation region 104 is performed in a common etching step.

As illustrated and described in connection with FIG. 2, the semiconductor device may include an active region and an edge termination region, and the charge shielding layer 106 is only formed in the edge termination region. The charge shielding layer 106 is formed over the upper portion 104_2 of the isolation region 104 and allows for improved subsequent conformal deposition of a metal barrier layer due to its edge 106_1 having a sidewall which slopes inward at a first angle $\alpha$ of equal to or less than 50 degrees, or of equal to or less than 45 degrees, with respect to a first direction x.

Figures 3D, 3E, 3F:
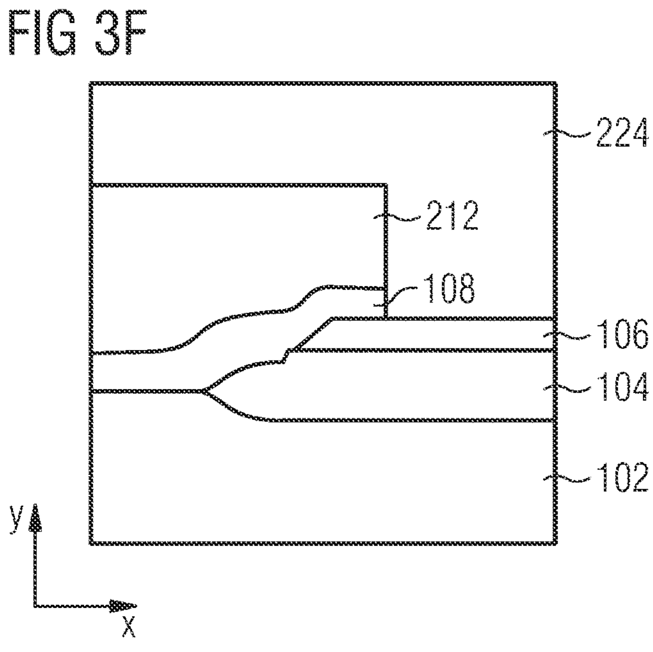

As shown in FIG. 3D, a metal barrier layer 108 is formed over the charge shielding layer 106 and over the isolation region 104. The metal barrier layer 108 may be formed by a deposition, e.g., physical vapor deposition, or the like. The metal barrier layer 108 may include a single layer of a same material, or a stack of layers having different materials.

FIG. 3E shows the semiconductor device after a metal layer 212 has been formed over at least a part of the metal barrier layer 108. In one example, the metal layer 212 has been formed by a plating process and, e.g., a seed layer (not shown) may have been formed first and after that, the metal layer 212 may have been formed by electro-chemical deposition (ECD). Alternatively, the metal layer 212 may have been deposited using deposition techniques other than ECD.

Further, FIG. 3E shows the semiconductor device after an etching step has been performed. In one example, the metal layer 212 may have been used as hardmask for etching the metal barrier layer 108. Alternatively, standard semiconductor processing such as photolithography, masking and etching may have been used to structure at least the metal barrier layer 108. In one example, the metal layer 212 is etched first and, in a subsequent step, the metal barrier layer 108 is etched. The metal barrier layer 108 is etched to expose a part of the charge shielding layer 106.

As shown in FIG. 3F, a passivation layer 224 is formed at least over the exposed part of the charge shielding layer 106 and over at least a part of the metal layer 212. The passivation layer 224 may be formed by a deposition, e.g., chemical vapor deposition, or the like. The passivation layer 224 may include a single layer of a same material, or a stack of layers having different materials.

FIG. 4 illustrates a flowchart of an exemplary method of manufacturing a semiconductor device.

The method may be applied to manufacture a semiconductor device as illustrated and described earlier herein in connection with FIG. 1, FIG. 2 and FIGS. 3A-3F.

At step S1, an isolation region is formed at a main surface of a substrate.

At step S2, a charge shielding layer is formed over the isolation region.

At step S3, the charge shielding layer is etched to form an edge that has a sidewall which slopes inward at a first angle of equal to or less than 50 degrees.

At step S4, the isolation region is etched to form an upper portion of the isolation region protruding from a lower portion of the isolation region.

At step S5, a metal barrier layer is formed over the charge shielding layer and over the isolation region.

Examples of the present invention are summarized here. Other examples can also be understood from the entirety of the specification and the claims filed herein.

Example 1: A semiconductor device, comprising: a substrate; an isolation region formed at a first main surface of the substrate, wherein the isolation region comprises a lower portion and an upper portion protruding from the lower portion; a charge shielding layer formed over at least a part of the upper portion of the isolation region, wherein an edge of the charge shielding layer has a sidewall which slopes inward at a first angle of equal to or less than 50 degrees; and a metal barrier layer formed over at least a part of the charge shielding layer and over at least a part of the lower portion of the isolation region Example 2: The semiconductor device of example 1, wherein the lower portion of isolation region is not covered by the charge shielding layer.

Example 3: The semiconductor device of one of the preceding examples, wherein the charge shielding layer is formed directly on the at least a part of the upper portion of the isolation region.

Example 4: The semiconductor device of one of the preceding examples, wherein the charge shielding layer comprises at least one of nitride, oxide and aluminum.

Example 5: The semiconductor device of one of the preceding examples, wherein the charge shielding layer is at least two times as thick as the upper portion of the isolation region.

Example 6: The semiconductor device of one of the preceding examples, wherein the metal barrier layer comprises a stack of layers.

Example 7: The semiconductor device of one of the preceding examples, further comprising a metal layer formed over at least a part of the metal barrier layer, wherein the metal layer comprises copper.

Example 8: The semiconductor device of one of the preceding examples, wherein an edge of the upper portion of the isolation region has a sidewall which slopes inward at a second angle between 35 degrees and 90 degrees.

Example 9: The semiconductor device of one of the preceding examples, wherein the isolation region comprises silicon dioxide.

Example 10: The semiconductor device of one of the preceding examples, further comprising a passivation layer formed over the charge shielding layer.

Example 11: The semiconductor device of one of the preceding examples, wherein the semiconductor device is a power semiconductor device, comprising: an active region comprising at least one active device configured to conduct a load current between the first main surface of the substrate and a second main surface of the substrate; and an edge termination region arranged between the active region and an edge of the power semiconductor device, wherein the charge shielding layer is formed in the edge termination region.

Example 12: A method of manufacturing a semiconductor device, the method comprising: forming an isolation region at a main surface of a substrate; forming a charge shielding layer over the isolation region; etching the charge shielding layer to form an edge that has a sidewall which slopes inward at a first angle of equal to or less than 50 degrees; etching the isolation region to form an upper portion of the isolation region protruding from a lower portion of the isolation region; and forming a metal barrier layer over the charge shielding layer and over the isolation region.

Example 13: The method of example 12, wherein etching the charge shielding layer and etching the isolation region is performed in a common etching step.

Example 14: The method of one of examples 12 to 13, further comprising: forming a metal layer over at least a part of the metal barrier layer; and etching at least the metal barrier layer to expose a part of the charge shielding layer.

Example 15: The method of example 14, further comprising: forming a passivation layer at least over the exposed part of the charge shielding layer and over at least a part of the metal layer.

Example 16: The method of one of examples 12 to 15, wherein etching the isolation region to form an upper portion protruding from a lower portion of the isolation region comprises forming an edge of the upper portion of isolation region having a sidewall which slopes inward at an angle between 35 degrees and 90 degrees.

Example 17: The method of one of examples 12 to 16, wherein the charge shielding layer comprises at least one of nitride, oxide and aluminum.

Example 18: The method of one of examples 12 to 17, wherein the charge shielding layer is formed directly on the isolation region.

Example 19: The method of one of examples 12 to 18, wherein the metal barrier layer comprises a stack of layers.

Example 20: The method of one of examples 12 to 19, wherein the isolation region comprises silicon dioxide.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A semiconductor device, comprising:

a substrate;

an isolation region at a first main surface of the substrate, wherein the isolation region comprises a lower portion and an upper portion protruding from the lower portion;

a charge shielding layer over at least a part of the upper portion of the isolation region, wherein an edge of the charge shielding layer has a sidewall which slopes inward at a first angle of equal to or less than 50 degrees; and a metal barrier layer over at least a part of the charge shielding layer and over at least a part of the lower portion of the isolation region.

2. The semiconductor device of claim 1, wherein the lower portion of the isolation region is not covered by the charge shielding layer.

3. The semiconductor device of claim 1, wherein the charge shielding layer is directly on the at least a part of the upper portion of the isolation region.

4. The semiconductor device of claim 1, wherein the charge shielding layer comprises at least one of nitride, oxide and aluminum.

5. The semiconductor device of claim 1, wherein the charge shielding layer is at least two times as thick as the upper portion of the isolation region.

6. The semiconductor device of claim 1, wherein the metal barrier layer comprises a stack of layers.

7. The semiconductor device of claim 1, further comprising a metal layer over at least a part of the metal barrier layer, wherein the metal layer comprises copper.

8. The semiconductor device of claim 1, wherein an edge of the upper portion of the isolation region has a sidewall which slopes inward at a second angle between 35 degrees and 90 degrees.

9. The semiconductor device of claim 1, wherein the isolation region comprises silicon dioxide.

10. The semiconductor device of claim 1, further comprising a passivation layer over the charge shielding layer.

11. The semiconductor device of claim 1, wherein the semiconductor device is a power semiconductor device and further comprises:

an active region comprising at least one active device configured to conduct a load current between the first main surface of the substrate and a second main surface of the substrate; and an edge termination region arranged between the active region and an edge of the power semiconductor device, wherein the charge shielding layer is disposed in the edge termination region.

12. A method of manufacturing a semiconductor device, the method comprising:

forming an isolation region at a main surface of a substrate;

forming a charge shielding layer over the isolation region;

etching the charge shielding layer to form an edge that has a sidewall which slopes inward at a first angle of equal to or less than 50 degrees;

etching the isolation region to form an upper portion of the isolation region protruding from a lower portion of the isolation region; and forming a metal barrier layer over the charge shielding layer and over the isolation region.

13. The method of claim 12, wherein etching the charge shielding layer and etching the isolation region are performed in a common etching step.

14. The method of claim 12, further comprising:

forming a metal layer over at least a part of the metal barrier layer; and etching at least the metal barrier layer to expose a part of the charge shielding layer.

15. The method of claim 14, further comprising:

forming a passivation layer at least over the exposed part of the charge shielding layer and over at least a part of the metal layer.

16. The method of claim 12, wherein etching the isolation region to form the upper portion protruding from the lower portion of the isolation region comprises forming an edge of the upper portion of isolation region having a sidewall which slopes inward at a second angle between 35 degrees and 90 degrees.

17. The method of claim 12, wherein the charge shielding layer comprises at least one of nitride, oxide and aluminum.

18. The method of claim 12, wherein the charge shielding layer is formed directly on the isolation region.

19. The method of claim 12, wherein the metal barrier layer comprises a stack of layers.

20. The method of claim 12, wherein the isolation region comprises silicon dioxide.

* * * * *